(12) United States Patent
Hoenigschmid et al.

(10) Patent No.: US 6,552,378 B1
(45) Date of Patent: Apr. 22, 2003

(54) ULTRA COMPACT DRAM CELL AND METHOD OF MAKING

(75) Inventors: Heinz Hoenigschmid, Starnberg (DE); Louis Lu-Chen Hsu, Fishkill, NY (US); Jack Allan Mandelman, Stormville, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/385,931

(22) Filed: Aug. 30, 1999

Related U.S. Application Data

(63) Continuation of application No. 09/093,904, filed on Jun. 8, 1998, now Pat. No. 6,037,620.

(51) Int. Cl.[7] ............................................. H01L 27/108
(52) U.S. Cl. ........................ 257/296; 257/301; 257/302; 257/303
(58) Field of Search ................................ 257/296, 301, 257/302, 303

(56) References Cited

U.S. PATENT DOCUMENTS

| | | | |
|---|---|---|---|
| 4,688,073 A | 8/1987 | Goth et al. ................... 357/56 |
| 5,406,515 A | * 4/1995 | Rajeevakumar ............. 365/182 |
| 5,585,657 A | 12/1996 | Efland et al. ................ 257/335 |
| 5,691,549 A | 11/1997 | Lam et al. ................... 257/282 |
| 5,814,895 A | 9/1998 | Hirayama .................... 257/903 |
| 6,100,131 A | * 8/2000 | Alsmeier ..................... 438/243 |
| 6,130,145 A | * 10/2000 | Ilg et al. ..................... 438/592 |
| 6,172,390 B1 | * 1/2001 | Rupp et al. .................. 257/302 |
| 6,236,079 B1 | * 5/2001 | Nitayama et al. ........... 257/306 |
| 6,265,741 B1 | * 7/2001 | Schrems ..................... 257/301 |

FOREIGN PATENT DOCUMENTS

| JP | 01-296658 | 11/1989 |
|---|---|---|
| JP | 05-198772 | 8/1993 |
| JP | 08-083892 | 3/1996 |
| JP | 08-088332 | 4/1996 |
| JP | 09/199688 | 7/1997 |

* cited by examiner

Primary Examiner—Sara Crane
(74) Attorney, Agent, or Firm—Daryl K. Neff; Todd M. C. Li

(57) ABSTRACT

A structure and method of manufacture is disclosed herein for a semiconductor memory cell having size of 4.5 F2 or less, where F is the minimum lithographic dimension. The semiconductor memory cell includes a storage capacitor formed in a trench, a transfer device formed in a substantially electrically isolated mesa region extending over a substantial arc of the outer perimeter of the trench, a buried strap which conductively connects the transfer device to the storage capacitor, wherein the transfer device has a controlled conduction channel located at a position of the arc removed from the buried strap.

9 Claims, 7 Drawing Sheets

ULTRA COMPACT DRAM CELL AND METHOD OF MAKING

This application is a continuation of application Ser. No. 09/093,904, filed Jun. 8, 1998, now U.S. Pat. No. 6,037,620.

FIELD OF THE INVENTION

The present invention relates to integrated circuit memory devices and more specifically to a dynamic random access memory cell structure and a fabrication method therefor.

BACKGROUND OF THE INVENTION

According to "Moore's Law" as it is popularly known, the scale of integrated circuit (IC) density has historically doubled once about every 18 to 24 months. IC manufacturers recognize a need to continue increasing the scale of integration at this pace. Manufacturers have not been able to achieve the necessary increase in density merely by using sharper photolithography techniques to linearly shrink the size of features on an IC. Other changes have had to be made, as only some features can be scaled linearly from one IC generation to the next, while other features can be scaled only by a fraction of the reduction in lithographic scale.

Features formed within the first few levels of the semiconductor surface of a wafer are conveniently measured in units of minimum lithographic feature size F or minimum lithographic dimension F. The minimum lithographic dimension F is defined as the smallest unit of length for which a feature can be defined by a photolithographic process of exposing a photoresist resist layer on the wafer through a mask, developing the resist, removing either the developed or undeveloped portions of the resist, and then etching the areas of the wafer that are uncovered.

A manufacturer selects a minimum feature size as a "ground rule" for each generation of ICs to be produced. The ground rule is determined in consideration of the many elements of the photolithographic process: mask fabrication, illumination sources, optical elements between the illumination source and the wafer, and the properties of the photoresist, as well as the precision of the most critical etch step to be performed. Determination of the ground rule must also necessarily take into account the reliability of the photolithographic process to define features over the desired extent of the wafer, and to operate without error over the desired maintenance cycle of the process equipment. After the ground rule has been selected for a particular generation of ICs, no feature can be defined by the photolithographic process any smaller than that ground rule. As used herein throughout, the terms "minimum feature size F" and "minimum lithographic dimension F" are refer to a selected ground rule as described herein.

A DRAM cell structure that is reduced in size in relation to minimum lithographic dimensions is particularly advantageous because it provides a greater increase in the scale of integration than a mere reduction in the ground rule. In addition, even when no reduction is made in the minimum lithographic dimension F for a particular generation of ICs, a substantial reduction in the area occupied by the DRAM cell, in terms of minimum lithographic dimensions ($F^2$), could provide the increased scale of integration needed to keep pace with Moore's Law.

Some existing deep trench DRAM cell designs, such as those described in U.S. Pat. Nos. 5,264,716 and 5,360,758, incorporate a polysilicon filled deep trench as a storage capacitor which is conductively connected by a deep trench outdiffusion known as a buried strap to the drain of an insulated gate field effect transistor (IGFET) located within a shallow well just below the surface of a monocrystalline silicon substrate. In such structures, the edge of the outdiffusion from the buried strap lies very close (usually less than the minimum lithographic dimension F) to the channel region of the IGFET). In addition, because of the way the buried strap is formed by outdiffusion of dopant ions from inside the deep trench, the outdiffused doping profile extends a direct path from the trench to the channel region. The proximity of the strap and the trench to the channel region of the IGFET tends to decrease the threshold voltage $V_T$ of the n-type IGFET of such memory cells. To restore the threshold voltage Vt to the desired level, the shallow well in which the IGFET is located is implanted with ions to high dopant concentrations. However, the high well dopant concentration greatly increases the junction leakage, subthreshold voltage swing and the substrate sensitivity of the IGFET.

The article by T. Ozaki et al. entitled "0.228 um$^2$ Trench Cell Technologies with Bottle-Shaped Capacitor for 1 Gbit DRAMs," *IEDM Digest of Technical Papers*, 1995, pp. 661–664 ("the Ozaki et al. Article") describes a proposed DRAM cell design which has dimensions of $6F^2$. That proposed cell design is similar to the deep trench DRAM cell designs described above in that the conductive path from the deep trench storage capacitor through the transfer device to the bitline-contact is essentially a straight line, except that the design described in the Ozaki et al. Article requires a surface strap rather than a buried strap.

In order to achieve the small cell size, the design described in the Ozaki et al. Article requires the edge of the deep trench storage capacitor to be placed very close to the gate conductor which controls the transfer device of the cell. Consequently, errors which occur in the positioning of masks which define the deep trench and the gate conductor (even those which are within overlay tolerances) can substantially decrease the channel width and/or prevent the surface strap between the deep trench and the channel from forming. Consequently, existing process tolerances place great obstacles to the implementation of the design described in the Ozaki et al. Article. In addition, the high probability of such channel shortening errors requires high well dopant concentrations to overcome the expected short channel effects which, as described above, leads to undesirable device degradation. As the integration density increases, a new structure is needed by which the strap and trench regions of the memory cell are further removed from the channel region of the IGFET. In that way, dopant concentrations in the IGFET can be reduced, thereby reducing the junction capacitance and improving device characteristics.

Commonly-assigned U.S. patent application Ser. No. 09/007,906, U.S. Pat. No. 6,069,390, filed Jan. 15, 1998 entitled "Semiconductor Integrated Circuits" describes a self-linking active semiconductor device structure which is formed in a substantially continuous mesa region. A FET such as the device described in the above incorporated patent application, Ser. No. 09/007,908, U.S. Pat. No. 6,177, 299, can be fabricated in the mesa region as the active semiconductor device, for example. This patent application is hereby incorporated herein by reference.

Commonly-assigned U.S. patent application Ser. No. 09/007,906, U.S. Pat. No. 6,069,390, filed Jan. 15, 1998 entitled "Semiconductor Integrated Circuits" describes a self-linking active semiconductor device structure which is formed in a substantially continuous mesa region. A FET such as the device described in the above incorporated patent application, Ser. No. 09/007,908, U.S. Pat. No. 6,177, 299, can be fabricated in the mesa region as the active semiconductor device, for example. This patent application is hereby incorporated herein by reference.

Accordingly, it is an object of the invention to provide a cell structure for a DRAM which occupies reduced area of the wafer surface in terms of minimum lithographic dimensions.

Another object of the invention is to provide an ultra compact DRAM array structure.

Still another object of the invention is to provide a method of fabricating a DRAM cell and related support devices by a single unified process.

Another object of the invention is to provide a structure for a DRAM memory cell in which the separation is proportionately increased between the strap and the channel region of the access transistor.

Another object of the invention is to provide a cell structure for a DRAM by which dopant concentrations within the IGFET device can be reduced in relation to the case where the strap is very close to the channel.

Another object of the invention is to provide a cell structure for a DRAM which has reduced junction capacitance.

SUMMARY OF THE INVENTION

These and other objects are provided by the semiconductor memory cell of the present invention. Accordingly, a semiconductor memory cell constructed according to the invention includes a storage capacitor formed in a trench etched into a substrate, a transfer device formed in a substantially electrically isolated mesa region extending over a substantial arc of the outer perimeter of the deep trench, a buried strap conductively connecting the transfer device to the storage capacitor, wherein the transfer device includes a controlled conduction channel located at a position of the arc removed from the buried strap.

Preferably, the controlled conduction channel is located at a position which does not present a straight line conduction path to the buried strap. Preferably, the transfer device is of the insulated gate field effect transistor (IGFET) type, having a pair of source drain regions connected the buried strap and to a bitline contact, respectively, and a channel region which forms the controlled conduction channel.

In a preferred embodiment, the strap and the bitline contact are conductively connected to the mesa region at positions of the arc which are located across the trench from each other.

Importantly, the area occupied by the cell on a substrate is preferably 4.5 $F^2$ or less, wherein F is defined as minimum lithographic feature size. In addition, it is preferred that this advantage be realized when the area occupied by the deep trench is greater than or equal to about $F^2$.

Another preferred embodiment of the invention is a semiconductor cell array structure including a group of semiconductor memory cells each having a storage capacitor formed in a trench and a transfer device formed in a substantially electrically isolated mesa region extending over a substantial arc of the outer perimeter of the deep trench, wherein the mesa region conductively connects the storage capacitor to a bitline contact, and a shallow trench isolation (STI) region partially overlays each trench and forms a surface over which a gate conductor is deposited.

The present invention is also embodied in a method of forming a semiconductor memory cell, which includes the steps of:

forming a storage capacitor in a deep trench etched into a substrate including a monocrystalline semiconductor;

forming a shallow trench isolation (STI) region at least partially overlaying the deep trench;

forming and outdiffusing a strap in a sidewall of the deep trench;

forming first spacers on exterior surfaces of the STI region and deep trench;

etching, selective to the monocrystalline semiconductor;

removing the first spacers to expose a mesa region of monocrystalline semiconductor located on exterior sidewalls of the deep trench and STI region and conductively connected to the strap; adjusting dopant concentrations in at least a portion of the mesa region to form a channel region and source/drain regions;

forming a gate dielectric over at least the channel region; depositing a gate conductor over the channel region; and forming a bitline contact to a first of the source/drain regions.

Preferably, the fabrication method further includes the steps of forming second spacers on exposed sidewalls of the first spacers; and prior to removing the first and second spacers, growing a field oxide over exposed surfaces of the semiconductor material.

In addition, the method preferably further includes the step of implanting dopant ions in locations of the substrate where the field oxide is grown.

The step of forming and outdiffusing a strap preferably includes the steps of etching an upper portion of the storage capacitor including a dielectric sidewall of the storage capacitor, refilling the etched portion with a highly doped fill material; and outdiffusing dopant ions from the highly doped fill material into a region of the substrate outside the deep trench.

Finally, the source/drain regions are preferably formed in portions of the mesa region located on first and third exterior sidewalls of the union of the deep trench and the STI region, and the channel region is formed in a portion of the mesa region located on a second exterior sidewall, wherein the first and second sidewalls are contiguous and the second and third sidewalls are contiguous.

The invention is also embodied in a method of forming a plurality of memory cells in a semiconductor memory array, which includes the steps of forming storage capacitors in a deep trench etched into a substrate including a monocrystalline semiconductor; forming a shallow trench isolation (STI) region at least partially overlaying each deep trench of a group of deep trenches; forming and outdiffusing a buried strap in a sidewall of each deep trench; forming first spacers on exterior surfaces of the STI region and the deep trenches; etching, selective to the monocrystalline semiconductor; removing the first spacers to expose a mesa region of monocrystalline semiconductor located on exterior sidewalls of the union of the deep trenches and the STI region and conductively connected to each said buried strap; dividing the mesa region into discontinuous parts such that each part is connected to at most two buried straps; adjusting dopant concentrations in at least a portion of the mesa region to form a transfer device for each deep trench, each transfer device having a channel region and source/drain regions; forming a gate dielectric over at least the channel regions; depositing a gate conductor over the channel regions; and forming a bitline contact to respective ones of the source/drain regions.

In this embodiment, the step of dividing is preferably performed by applying a trim mask and etching areas defined by the mask.

DETAILED DESCRIPTION OF THE PREFERRED EMBODIMENTS

Figure 1:
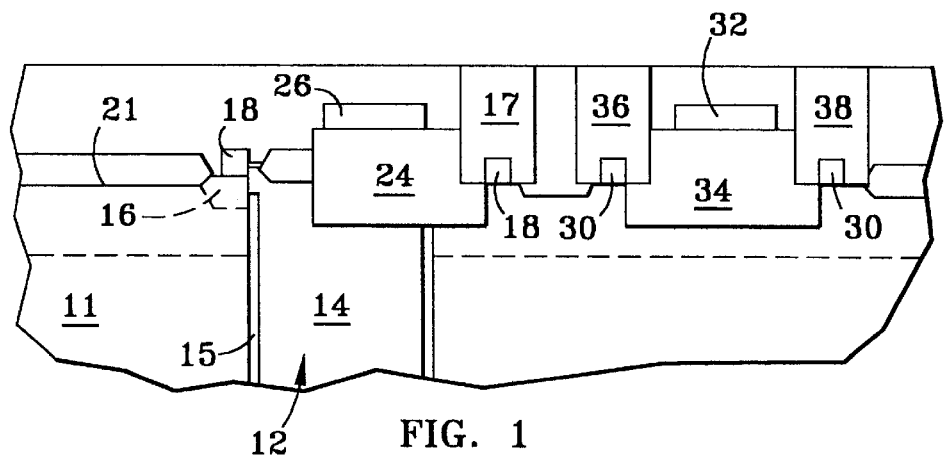
FIG. 1 is a cross-sectional view showing the structure of a DRAM cell and a support device formed according to the present invention.

FIG. 1 is a cross-sectional view showing a first embodiment of the present invention. Shown in FIG. 1 is a semiconductor memory cell 10 and a switching device 20 of a peripheral region adjacent thereto. Memory cell 10 includes a storage capacitor 12 formed in a deep trench 14 which is lined with a collar dielectric 15 near the surface of a semiconductor substrate 11 and with a node dielectric (not shown) where it extends below the bottom (not shown) of the collar dielectric 15. Memory cell 10 also includes a bitline contact 17, a transfer device 22 located within a mesa region 18, and a strap 16 which conductively connects storage capacitor 12 to mesa region 18. Since the strap 16 lies below the mesa region 18 in which the transfer device 22 is formed, it can be referred to as a "buried strap". Partially overlaying deep trench 14 is a shallow trench isolation (STI) region 24.

Figure 2:
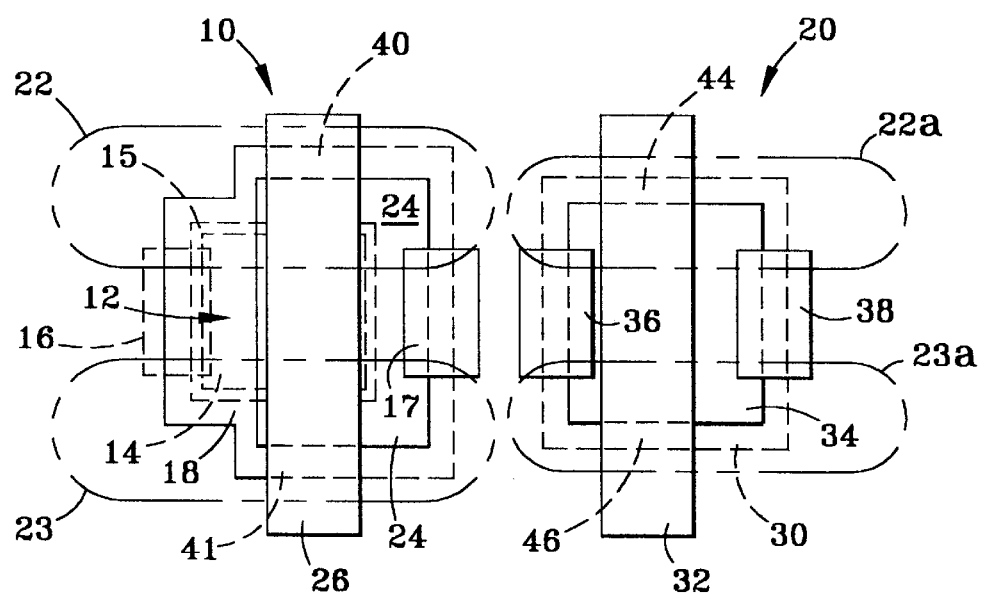
FIG. 2 is a top view showing the structure of a DRAM cell and a support device formed according to the present invention.

FIG. 2 is a top view showing the structure of memory cell 10 and switching device 20 on the surface 21 of the substrate. As shown in FIG. 2, STI region 24 partially overlays deep trench 14 and collar dielectric 15. Mesa region 18 is located on exterior sidewalls of deep trench 14 and STI region 24 and extends over a substantial arc of the outer perimeter of deep trench 14. Gate conductor 26 overlays STI region 24 and a channel region 40 of mesa region 18. Portions of mesa region 18 which lie outside of channel region 40 form source/drain regions of transfer device 22. Strap 16 and contact conductor 17 adjoin mesa region 18 in source/drain regions of the transfer device so formed. Exposed upper surfaces of mesa region 18 which lie away from the immediate vicinity of channel region 40 are preferably converted to a metal compound, e.g. tungsten silicide, to decrease resistance, as by a known method of depositing a metal over exposed portions of mesa region 18 and annealing to form the compound.

It will be understood that a second transfer device 23 is formed by the path of mesa region 18 from strap 16 to contact 17 through channel region 41 located on the opposite exterior sidewall of STI region 24 from channel region 40. As applied to DRAM devices, it will be understood that the second transfer device 23 matches the first transfer device 22 in device characteristics and is therefore useful in providing built-in redundancy against some failure mechanisms. In addition, second transfer device 23 increases the amount of current flow to and from storage capacitor 12.

Like memory cell 10, switching device 20 preferably includes an insulated gate field effect transistor (IGFET) 22a, located within a mesa region 30. Mesa region 30 is formed on exterior sidewalls of an STI region 34, and preferably extends around a substantial part of the perimeter of STI region 34. A gate conductor line 32 overlays STI region 34 and mesa region 30 at channel regions 44, 46. Signals to and from external circuitry (not shown) are input or output to switching device 20 through contact conductors 36 and 38. As with mesa region 18, exposed upper surfaces of mesa region 30 are preferably converted, by known method, to a metal compound such as tungsten silicide. As is the case with the DRAM cell, the switching device shown in FIG. 2 includes two IGFET devices 22a and 23a connected in parallel. Since the two devices 22a, 23a carry more current than one, fast switching times can be achieved. Alternatively, the two devices can be separated by use of an appropriate trim mask, thereby further increasing the circuit density.

It will be understood that transistor structures formed within mesa regions 18, 30 have superior immunity from short channel effects because of the proportionally large separation between the strap 16 or contact conductor 17, respectively, and the channel region 40 (FIG. 2), or between contact conductors 36, 38 and channel regions 44, 46. In addition, because the mesa regions 18, 30 extend over a substantial arc of the outer perimeter of deep trench 14 and STI region 24, there is no straight line conduction path between the buried strap 16 and the channel region 40. Because of this, good immunity from short channel effects is achieved. The improved immunity from short channel effects permits the width of the gate conductor 27 to be optionally decreased to a sublithographic dimension in order to increase the channel aspect ratio (W/L) of the IGFET.

Figure 3:
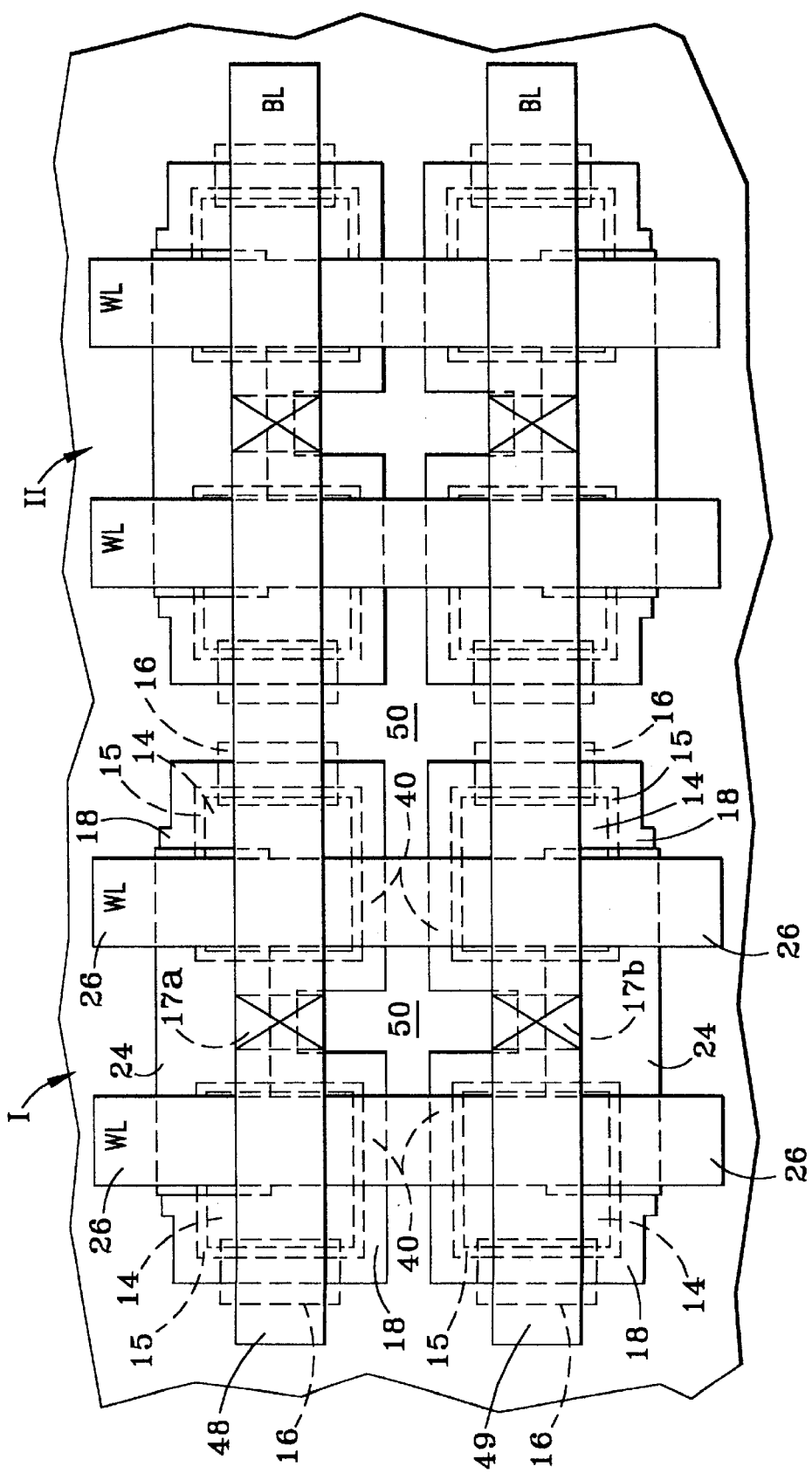
FIG. 3 is a top view showing the structure of a group of DRAM cells formed according to an embodiment of the invention having an open bitline configuration.

FIG. 3 shows an embodiment of the invention in which a group of memory cells 10 are arranged in an open bit line array pattern. As shown in FIG. 3, memory cells are arranged in regular patterned groups of cells each having four cells. As shown in FIG. 3, in each two cells in the upper half of groups I and II are traversed by a bitline 48 and share the same bitline contact while each two cells in the lower half of groups I and II are traversed by a bitline 49 and share the same bitline contact. Within group I, the cells shown in the upper part as shown on FIG. 3 share a bitline contact 17a, while the cells shown in the lower part of group I on FIG. 3 share a bitline contact 17b. An STI region 24 partially overlays the outer area of the four cells in each cell group I or II, while the central area between cells within each group I and II is covered with a field oxide 50, preferably formed by a thermal oxidation of the substrate semiconductor material.

Bitlines 48, 49 are formed at a preferred pitch (periodicity of adjacent bitlines) of 2F. Bitline contacts 17a, 17b are preferably formed in borderless manner, borderless to trench collars 15 and isolation region 24, in order to permit a decrease in spacing between the two trenches served by the same bitline contact, e.g. contact 17a. A phase-shifting lithography technique which advantageously reduces the spacing between trenches 14 to sublithographic dimensions is described in co-assigned U.S. Patent Application entitled: "Semiconductor Memory Array Having Sublithographic Spacing Between Adjacent Trenches and Method for Making the Same", Ser. No 09/093,902, U.S. Pat. No. 6,034,877, filed on even date herewith, which application is incorporated herein by reference.

Figure 4:
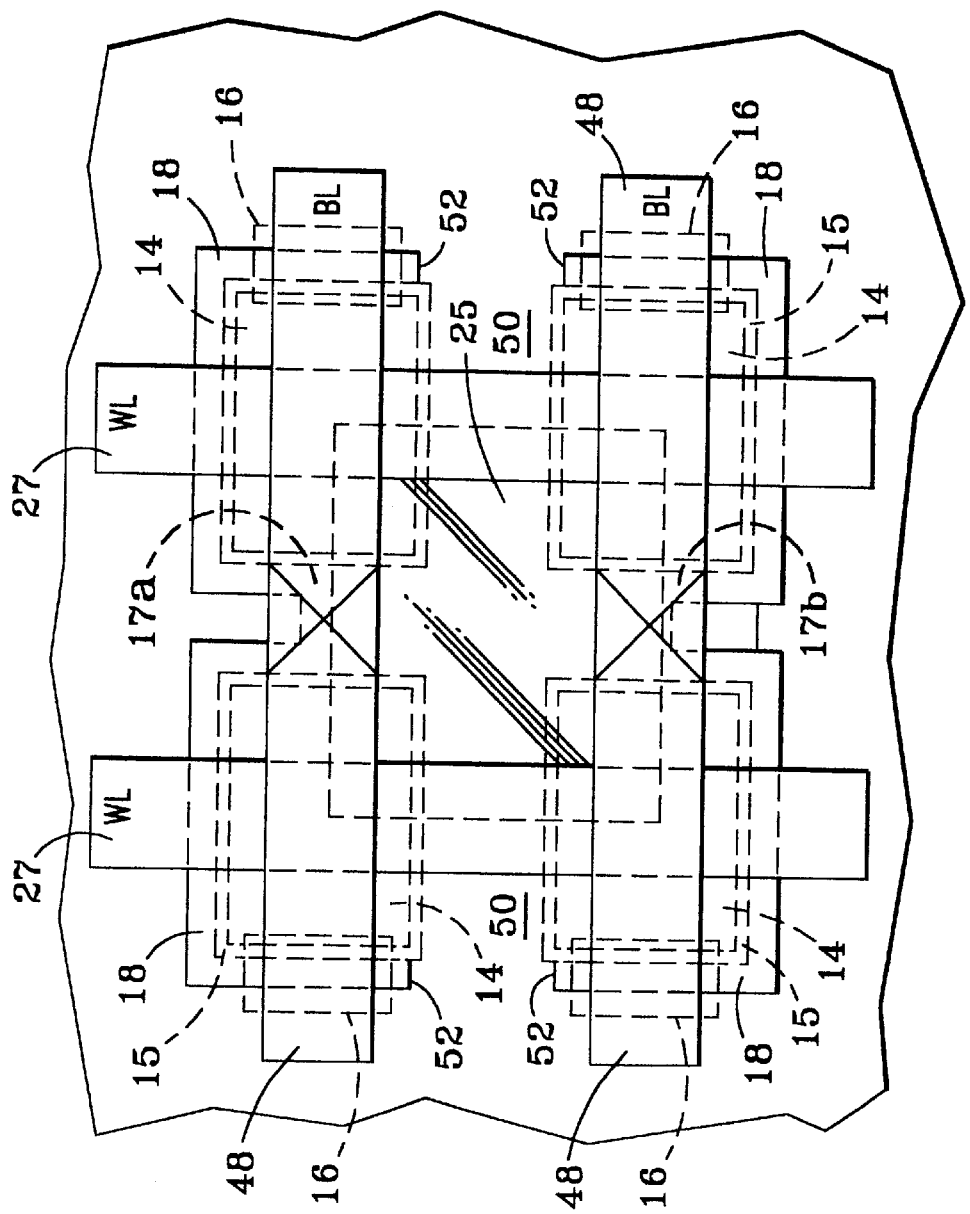
FIG. 4 is a top view showing the structure of a group of DRAM cells formed according to another embodiment of the invention also having an open bitline configuration.

FIG. 4 shows an alternative open bitline array embodiment in which STI region 25 is located in the center of a group of four memory cells. In this embodiment, mesa regions 18 do not extend all the way around trenches 14, as in the embodiment shown in FIG. 3. Rather, mesa regions 18 terminate at outer ends 52, such that the IGFET devices formed within the mesa regions 18 extend from the outer ends 52 to the bitline contacts, e.g. to bitline contact 17a in the upper left cell of FIG. 4. The central location of STI region 25 and the curtailment of mesa regions 18 to the outward facing sides of the trenches 14 within each group of four cells provides for better isolation between cells and greater immunity from parasitics.

Figure 4A:
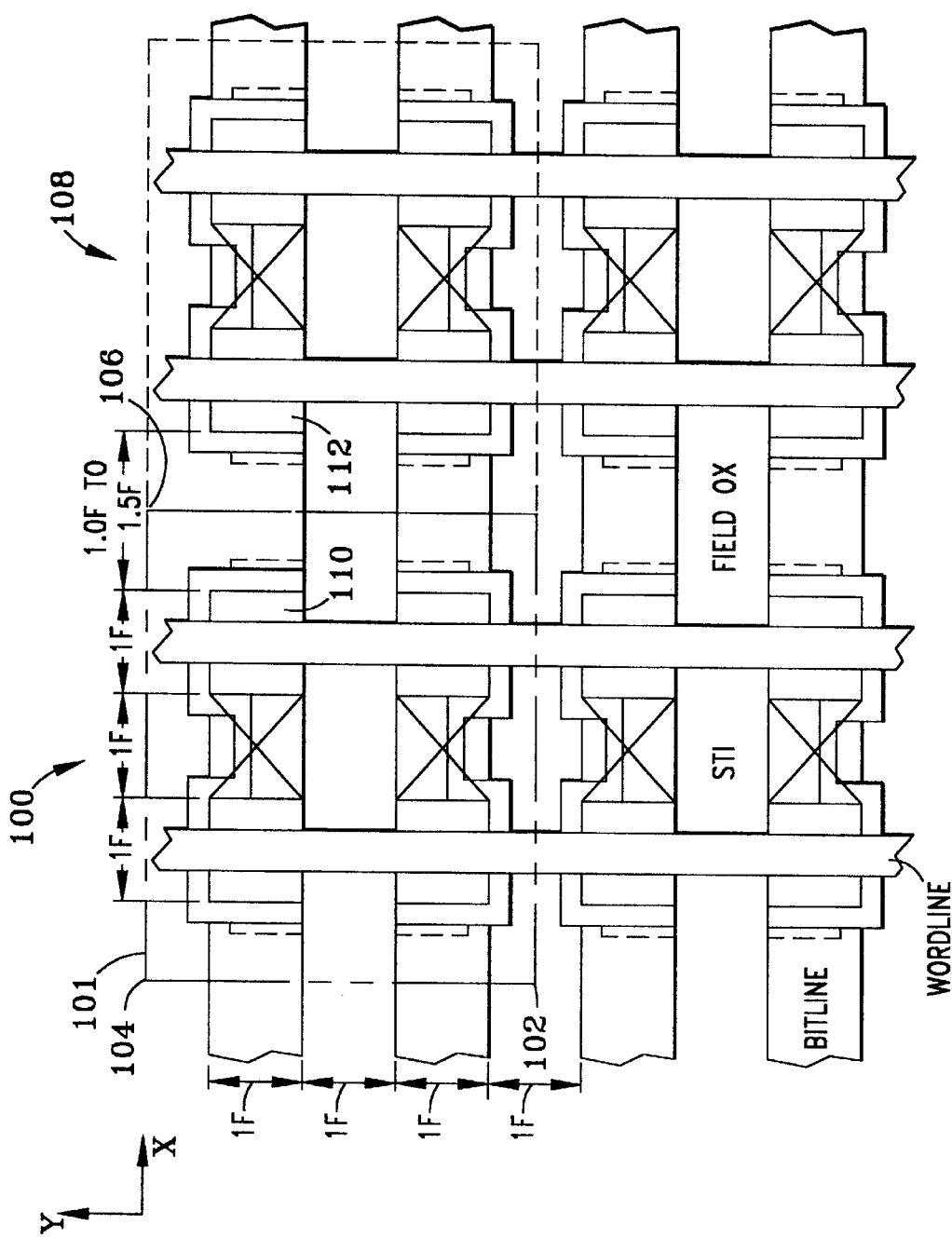
FIG. 4A is a top view illustrating the surface dimensions of a group of DRAM cells formed according to the invention.

As will be understood, the size of each DRAM memory cell achieved by the structures and methods disclosed herein is extremely small in terms of the minimum feature size F. FIG. 4A is a diagram showing the dimensions of features in adjacent groups of four cells, wherein cells of each group have a structure substantially as shown and described above with reference to FIG. 4. As shown in FIG. 4A, a cell group 100, including four DRAM cells, is shown as occupying the area within box 101. Deep trenches 14 are defined at minimum feature size F on each side and are positioned at a pitch of 1F with respect to other deep trenches in cell group 100. Where deep trenches 14 are adjacent to other deep trenches of neighboring cell groups, e.g. deep trenches 110 and 112 of cell groups 100 and 108, the pitch in the direction of bitlines (the x-direction) may preferably be increased from 1F to 1.5F to provide greater protection against undesirable influence between the transistors of respective cells. This strategy is advantageous since it is desired to use only field oxide for device isolation. However, it is not required to position deep trenches at increased pitch where such cells are isolated only by field oxide and the pitch can be reduced to 1F if desired.

Therefore, in calculating the area occupied by each DRAM cell, the dimensions of each cell group 100 are, from FIG. 4A, shown to be 4F in the direction y and 4F to 4.5F in the direction x (depending on whether increased pitch is desired between cells 110, 112 of adjacent cell groups). The area occupied by each four cell group is then $16F^2$, or $18F^2$ with the optional increased pitch. Dividing by four, it is seen that the size of each DRAM cell is $4F^2$ or $4.5F^2$ with the optional increased pitch.

With reference to FIG. 3 again, it will be understood that the pitch between deep trenches 14 of cell groups I and II shown therein are the same and that the same calculations of the dimensions apply.

Figure 5:
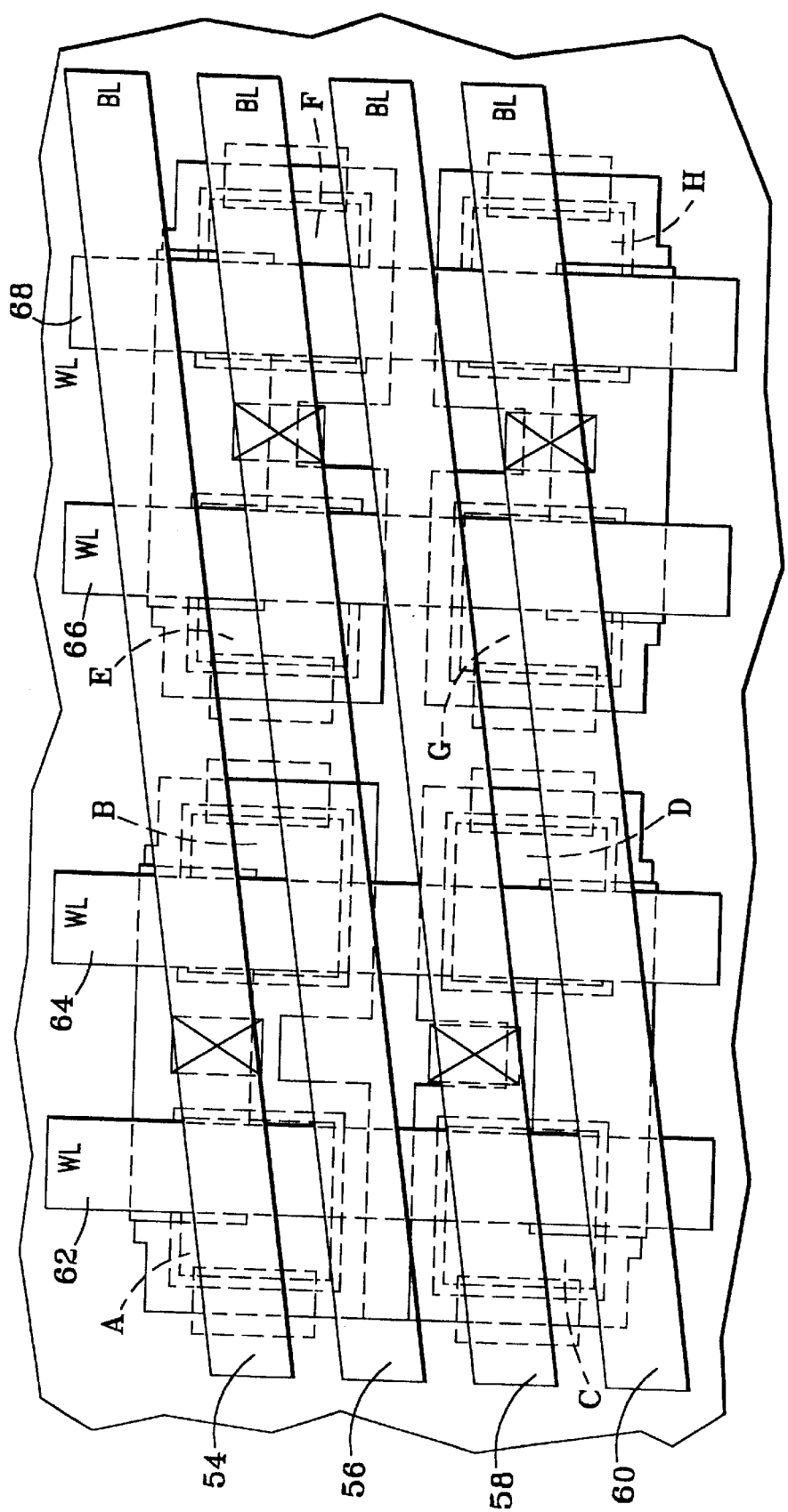
FIG. 5 is a top view showing the structure of a group of DRAM cells formed according to still another embodiment of the invention which has a folded bitline configuration.

FIG. 5 shows an embodiment of the invention in which cells are incorporated into a memory array having a folded bitline configuration. In this embodiment, the bitlines 54, 56, 58, and 60 do not access every pair of cells in succession, as is the case with bitlines 48 in the open bitline configuration (FIGS. 3,4). Rather, the bitlines access only every second pair of cells. As shown in FIG. 5, bitline 54 accesses only cells A and B, and does not access cells E and F. Similarly, bitline 56 does not access cells A and B while it does access cells E and F. Bitline 58 accesses cells C and D but does not access cells G and H. Finally, bitline 60 does not access cells C and D but does access cells G and H.

Figure 6:
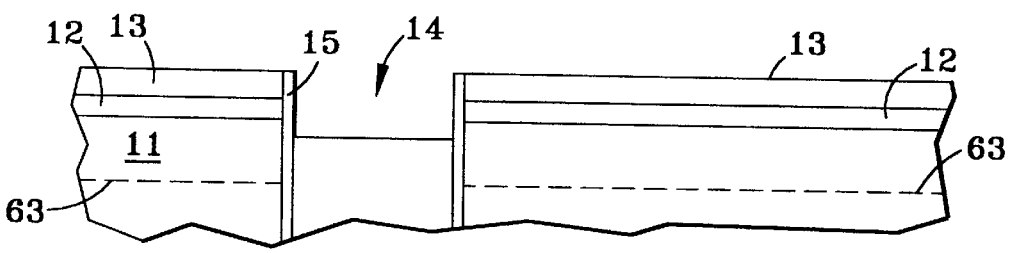
FIGS. 6–13 are cross-sectional views illustrating steps in fabricating a DRAM cell and a support device in accordance with the present invention.

The structure of memory cell 10 and switching device 20 having been described, the process of making these devices will now be described with reference to FIGS. 6 through 13. With reference to FIG. 6, substrate 11 is prepared first by making shallow well implants to a desired depth 63 into substrate 11. Then, an etch-distinguishable epitaxial layer 12 of semiconductor material is preferably grown over the semiconductor substrate 11 such that the original top surface of the semiconductor substrate forms an etch stop layer for an etch to be performed as described below. Alternatively, epitaxial layer 12 need not be employed as an etch distinguishable layer if a timed etch process can be adequately controlled.

Then a protective pad 13, preferably containing a layer each of oxide and nitride is deposited in that order over epi-layer 12. Deep trench 14 is formed by a process of reactive ion etching (RIE) through the pad 13, epi-layer 12, and into substrate 11. The formation of a buried plate, node dielectric, and conductive fill of the deep trench in forming a storage capacitor are performed according to known processes which are not unique to the present invention.

A collar dielectric 15 is formed and the deep trench 14 is filled with a material such as polysilicon. The collar 15 and fill material are recessed to a buried strap recess depth 64. Thereupon the trench is refilled with a material which is highly doped with respect to the doping concentration in the neighboring shallow well region (above line 63) of substrate 11. The refilled material supplies doping ions for formation of a buried strap between trench 14 and devices formed within the substrate 11. A preferred material for the substrate is highly doped silicon 11, and for the epi-layer intrinsic/lightly doped silicon, silicon germanium, or silicon carbide, such that substrate 11 forms an etch stop layer with respect to epi-layer 12. A preferred material for the collar dielectric is silicon oxide.

Figure 7:
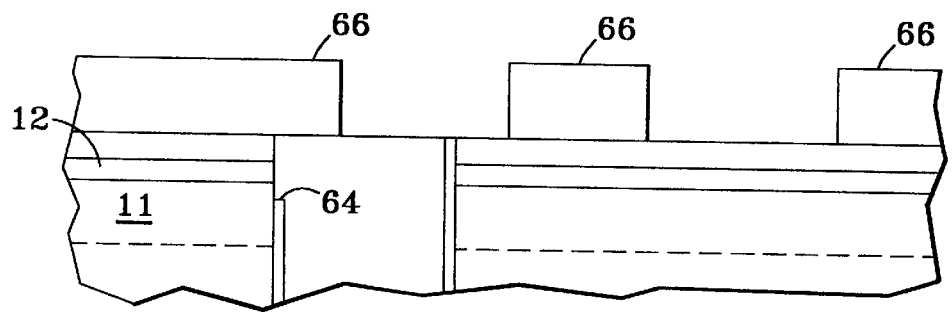
Figure 8:
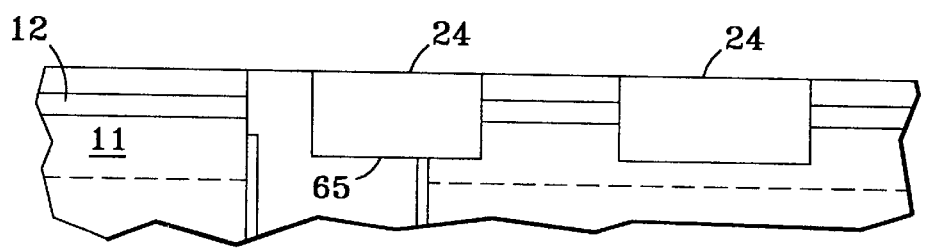

With reference to FIGS. 7–8, the collar dielectric 15 is recessed accordingly. Then, a shallow trench photoresist pattern 66 is formed over the pad. Shallow trenches are etched into substrate 11 by RIE process to a depth 65 greater than the buried strap recess depth 64 and the shallow trenches are filled with a dielectric material, preferably silicon oxide, to form shallow trench isolation (STI) regions 24.

Figure 9:
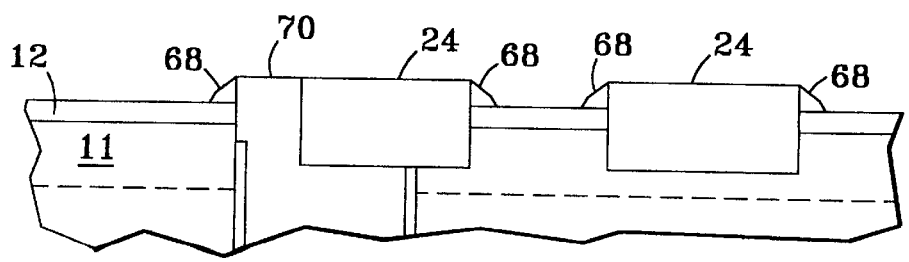

With reference to FIG. 9, the resist is stripped and the pad 13 is removed, as by wet etching selective to oxide and silicon. A layer of conformal material, preferably, silicon nitride ($Si_3N_4$), is deposited and then anisotropically or directionally etched, e.g. by RIE, to form sidewall spacers 68 on the sidewalls of STI regions 24 and trench polysilicon fill 70.

Figure 10:
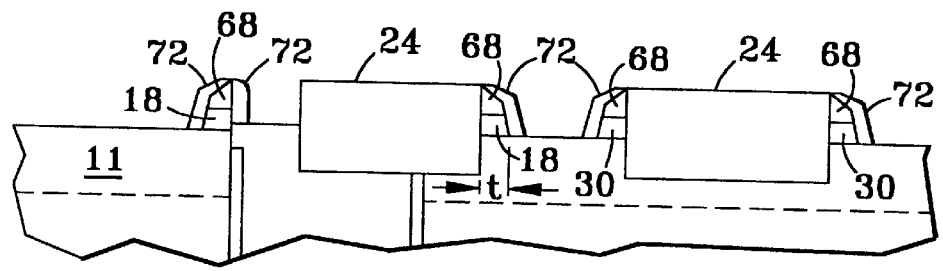

With reference to FIG. 10, epi-layer 12 is then anisotropically or directionally etched, as by RIE, to form mesa regions 18 and 30 under first sidewall spacers 68. Preferably, by controlling the width of sidewall spacers 68, the mesa regions are formed with thickness t along the surface of the substrate 11 which measures only in the hundreds of angstroms. A conformal layer of material, e.g. silicon nitride, is deposited and etched anisotropically or directionally, as by RIE, to form second sidewall spacers 72 which enclose and protect exposed sidewalls of mesa regions 18, 30.

Figure 11:
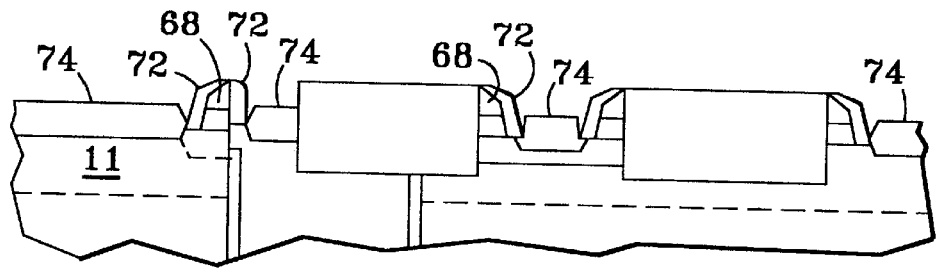
Figure 12:
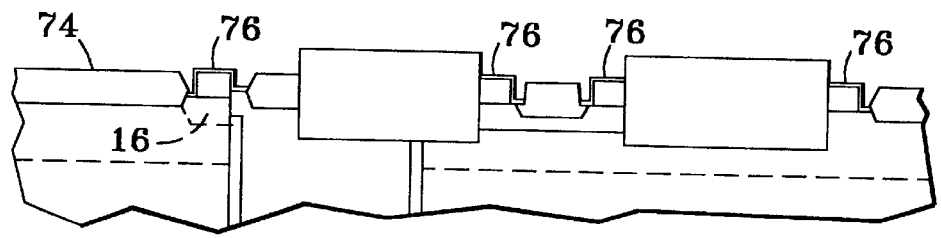
Figure 13:
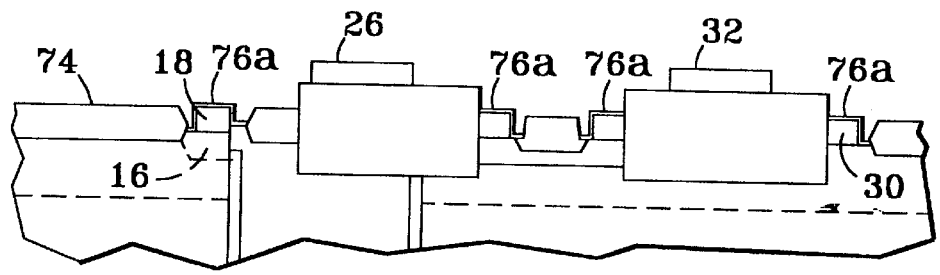

A thermal oxide 74 is then grown over exposed portions of the substrate 11, for use in isolating the mesa regions 18, 30, as shown in FIG. 11. Then, as shown in FIG. 12, first and second sidewall spacers 68, 72 are removed, as by wet etching. selective to silicon and oxide, and a dielectric layer 76 is grown or deposited, which may be a sacrificial oxide layer or a gate dielectric.

Ion implants are then performed to form regions of different carrier types and concentrations within mesa regions 18, 30. It will be understood that separate source/ drain implants and channel implants may not be required or desirable, since the doping concentration of mesa regions 18, 30, being formed in an epi-layer 12, are controlled independently from the doping concentration of substrate 11. For example, gate conductors 26, 32 (FIG. 13) can be deposited over the mesa regions 18, 30 as covered by dielectric layer 76, and then portions of mesa regions 18, 30 which are left exposed can be implanted with appropriate dopant ions to form source/drain regions therein. Alternatively, before depositing the gate conductors 26, 32, the mesa regions 18, 30 can be implanted with dopant ions of one type to form an n-type or p-type region. Then, the dielectric layer 76 (i.e. sacrificial oxide) is stripped and an appropriate gate dielectric is deposited or grown over the mesa regions 18, 30. Once the gate conductors 26, 32 have been deposited, a further dielectric layer 76a can be deposited or grown as a sacrificial oxide over the remaining portions of mesa regions 18, 30 and the source/drain regions can be counterdoped by implantation of ions of another type to form the opposite type region (i.e. p-type or n-type, respectively).

In a memory array embodiment such as that shown in FIG. 4, gate conductors 27 form wordlines (WLs) of the array. Preferably, the gate conductors 27 are formed in such way that the width of the gate conductors 27 is sublithographic, i.e. less than the minimum lithographic feature size F and preferably about 1/2 F. To form such subminimum width gate conductors 27, a mandrel (not shown) having a 1F opening can be defined by lithographic process, after which sidewall spacers are formed on the mandrel (by deposition of conformal layer followed by anisotropic or directional etching from above), and the gate conductor then deposited within the narrowed opening between the sidewall spacers.

While the invention has been described herein in accordance with certain preferred embodiments thereof, those skilled in the art will recognize the many modifications and enhancements which can be made without departing from the true scope and spirit of the invention set forth in the appended claims.

What is claimed is:

1. A semiconductor cell array structure comprising:

a group of semiconductor memory cells, each said memory cell having a storage capacitor formed in a respective trench and a transfer device having a conduction path extending in a direction of a perimeter of said trench including a channel region formed in a substantially electrically isolated semiconductor region, a shallow trench isolation (STI) region having a substantially vertical sidewall, said STI region partially overlaying at least one of said trenches, each said substantially isolated semiconductor region extending along the outside of a substantial portion of the perimeter of said trench and adjoining said substantially vertical sidewall wherein a single STI region partially overlays a plurality of said trenches.

2. The array structure of claim 1 wherein said semiconductor memory cells are further isolated by a field oxide.

3. The array structure of claim 1 further comprising a passing bitline and an active bitline, wherein each pair of said group of memory cells is traversed by said active bitline and said passing bitline.

4. The array structure of claim 3 wherein said active bitline contacts pairs of memory cells at successive even intervals and said passing bitline contacts pairs of memory cells at successive odd intervals such that said bitlines form a folded bitline configuration.

5. The array structure of claim 4 wherein said passing bitline and said active bitline are oriented on a diagonal with respect to the alignment of said deep trenches.

6. The array structure of claim 1 further comprising a plurality of bitlines, each bitline contacting pairs of memory cells at every successive interval such that said bitlines form an open bitline configuration.

7. The semiconductor cell array structure of claim 1 wherein the area occupied by said cell on a substrate is less than or equal to about 4.5 $F^2$, wherein F is defined as minimum lithographic feature size.

8. The semiconductor cell array structure of claim 1 wherein the area occupied by said cell on a substrate is less than or equal to about 4.0 $F^2$, wherein F is defined as minimum lithographic feature size.

9. The semiconductor cell array structure of claim 8 wherein the area occupied by said trench is greater than or equal to about $F^2$.

* * * * *